(12) United States Patent
Shum et al.

(10) Patent No.: US 6,596,184 B1
(45) Date of Patent: Jul. 22, 2003

(54) NON-HOMOGENEOUS LAMINATE MATERIALS FOR SUSPENSIONS WITH CONDUCTOR SUPPORT BLOCKS

(75) Inventors: Victor Wing-Chun Shum, San Jose, CA (US); Randall George Simmons, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/259,886

(22) Filed: Feb. 15, 1999

(51) Int. Cl.[7] .................................................. B44C 1/22
(52) U.S. Cl. .............................. 216/13; 216/22; 216/56; 216/99; 216/100; 216/105; 360/137
(58) Field of Search ................................ 216/13, 22, 56, 216/99, 100, 105, 83; 360/137

(56) References Cited

U.S. PATENT DOCUMENTS

| | | |
|---|---|---|
| 4,716,259 A | 12/1987 | Tokura et al. |
| 4,906,803 A | 3/1990 | Albrechta et al. |
| 4,996,623 A | 2/1991 | Erpelding et al. |
| 5,234,536 A * | 8/1993 | Pathasarathi et al. ....... 156/633 |
| 5,598,307 A | 1/1997 | Bennin |
| 5,701,218 A | 12/1997 | Boutaghou |
| 5,712,749 A | 1/1998 | Gustafson |
| 5,839,193 A * | 11/1998 | Bennin et al. ............. 29/896.9 |

FOREIGN PATENT DOCUMENTS

| | | |
|---|---|---|
| GB | 2295918 A | 12/1996 |
| JP | 406028828 A | 2/1994 |
| JP | 073113755 | 5/1997 |
| WO | WO 97/36290 | 10/1997 |

* cited by examiner

*Primary Examiner*—Randy Gulakowski
(74) *Attorney, Agent, or Firm*—Abdy Raissinia; Bracewell & Patterson, L.L.P.

(57) ABSTRACT

An integrated lead suspension is formed from a laminate of three materials in a variety of configurations having from three to five layers. The materials are stainless steel, polyimide and copper. Each layer is essentially homogeneous, but may be formed with one or more holes or voids prior to the formation of the laminate. The voids can be used to eliminate the need for double-sided etching or to make small features which would otherwise be unavailable with conventional manufacturing processes.

11 Claims, 4 Drawing Sheets

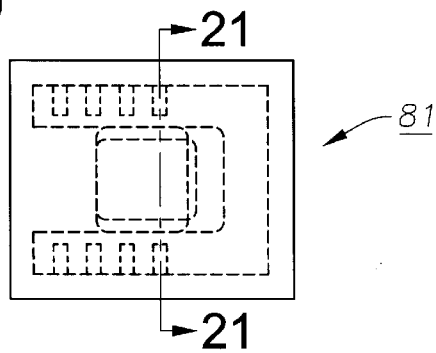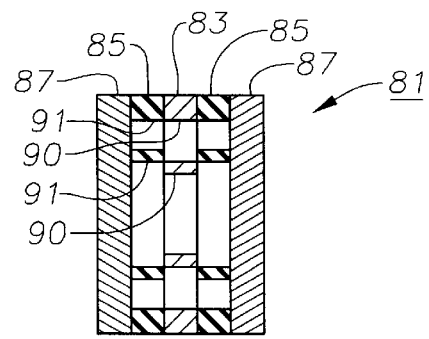
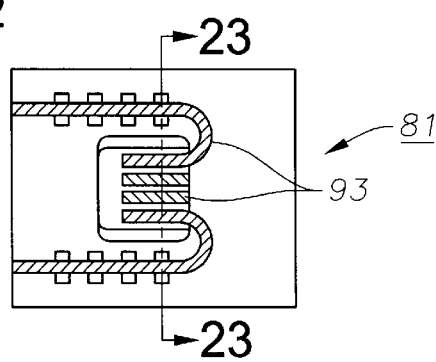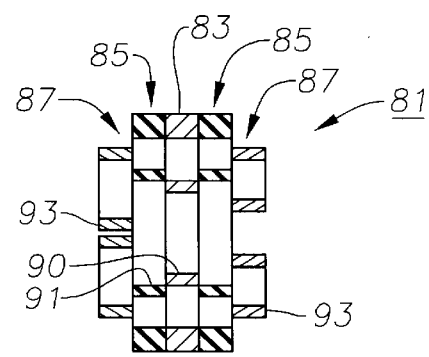
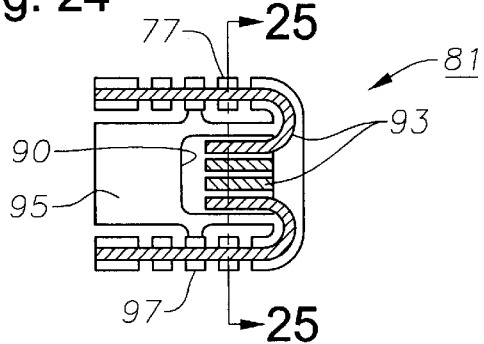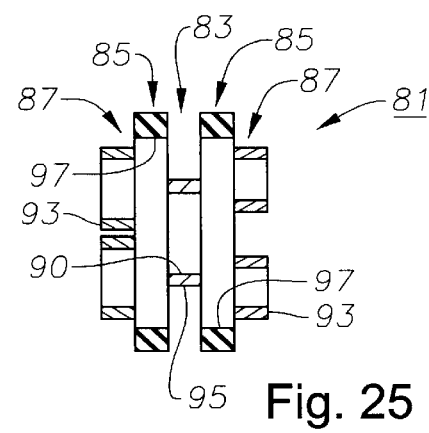

NON-HOMOGENEOUS LAMINATE MATERIALS FOR SUSPENSIONS WITH CONDUCTOR SUPPORT BLOCKS

BACKGROUND OF THE INVENTION

1. Technical Field

This invention relates in general to integrated lead suspensions for hard disk drives and in particular to fabricating and applying non-homogenous laminate materials to integrated lead suspensions with conductor support blocks.

2. Background Art

In hard disk drive manufacturing, one type of head gimbal assembly has an integrated lead suspension (ILS). An ILS is typically formed by laminating several layers of material together and then selectively etching the layers to achieve a desired architecture. Alternatively, the layers may be formed by plating them on top of one another. These layers usually comprise at least one of each of the following: a stainless steel substrates or support layer, an insulation layer such as a polyimide, and a conductor layer such as copper. An ILS with a bent lead type design must be etched on both sides to clear the polyimide on the bent lead. This step requires additional process time and adds cost to the suspension.

In an ILS, the conductors carry the electrical signals from the read/write heads to a flexible cable. The polarity of the signals at the heads determines the polarity of the termination pads at the flexible cable since the conductors cannot cross over one another. This is a serious problem if multiple heads with different polarities must be connected to the same flexible cable which has only one set of polarities.

The different layers of materials which form the laminate suspension have different coefficients of thermal expansion. The static attitudes of the heads, which are vital for their fly height control, can change due to environmental temperature and humidity changes. These changes will impact the fly height control of the sliders. Improved methods for manufacturing integrated lead suspensions are needed to address these issues.

DISCLOSURE OF THE INVENTION

An integrated lead suspension is formed from a laminate of three materials in a variety of configurations having from three to five layers. The materials are stainless steel, polyimide and copper. Each layer is essentially homogeneous, but may be formed with one or more holes or voids prior to the formation of the laminate. The voids can be used to eliminate the need for double-sided etching or to make small features which would otherwise be unavailable with conventional manufacturing processed.

BRIEF DESCRIPTION OF THE DRAWINGS

FIG. 20 is a plan view of the third embodiment of the suspension of FIG. 19 at an initial stage of processing.

FIG. 21 is a sectional end view of the suspension of FIG. 20 taken along the line 21—21 of FIG. 20.

FIG. 22 is a plan view of the suspension of FIG. 20 at an intermediate stage of processing.

FIG. 23 is a sectional end view of the suspension of FIG. 22 taken along the line 23—23 of FIG. 22.

FIG. 24 is a plan view of the suspension of FIG. 20 after final processing.

FIG. 25 is a sectional end view of the suspension of FIG. 24 taken along the line 25—25 of FIG. 24.

BEST MODE FOR CARRYING OUT THE INVENTION

Figure 1:
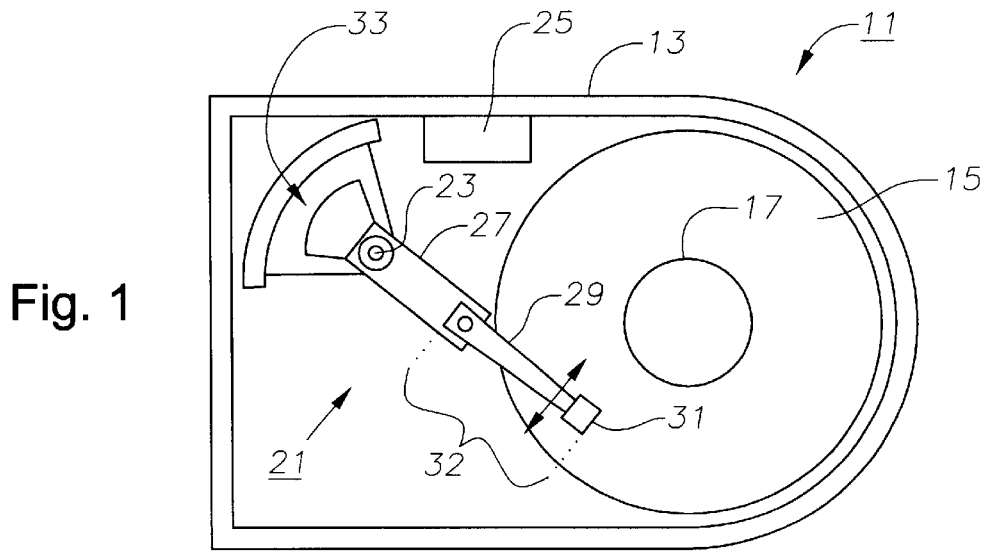
FIG. 1 is a schematic drawing of a hard disk drive.
Figure 2:
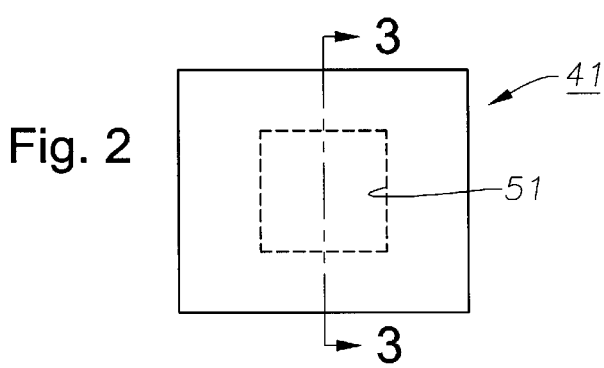
FIG. 2 is a plan view of a portion of a first embodiment of a suspension for the hard disk drive of FIG. 1 at an initial stage of processing and is constructed in accordance with the invention.
Figure 3:
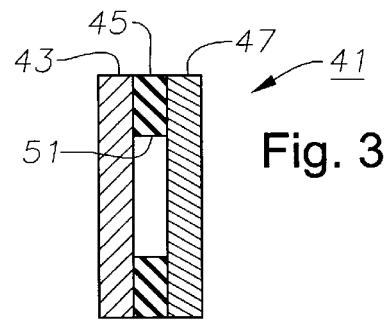
FIG. 3 is a sectional end view of the suspension of FIG. 2 taken along the line 3—3 of FIG. 2.
Figure 4:
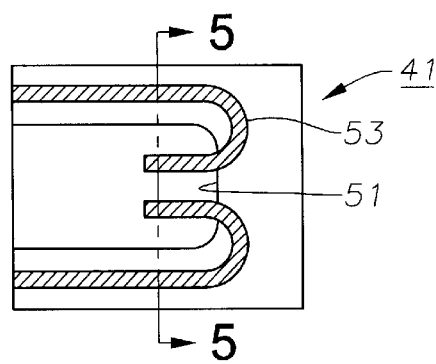
FIG. 4 is a plan view of the suspension of FIG. 2 at an intermediate stage of processing.
Figure 5:
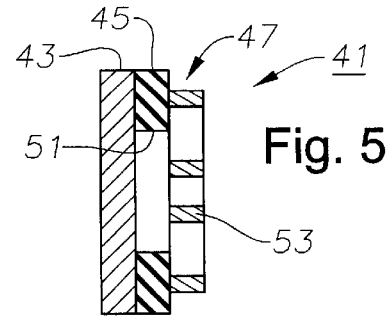
FIG. 5 is a sectional end view of the suspension of FIG. 4 taken along the line 5—5 of FIG. 4.
Figure 6:
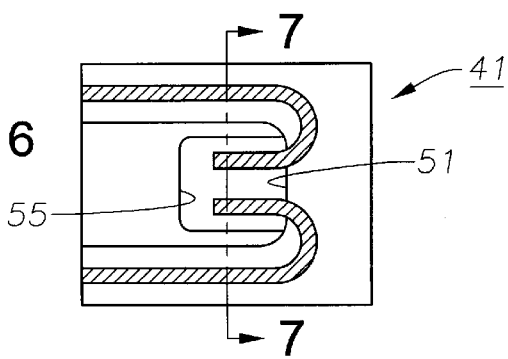
FIG. 6 is a plan view of the suspension of FIG. 2 after final processing.
Figure 7:
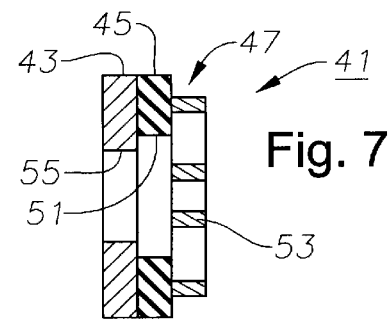
FIG. 7 is a sectional end view of the suspension of FIG. 6 taken along the line 7—7 of FIG. 6.

Referring to FIG. 1, a schematic drawing of an information storage system comprising a magnetic hard disk drive 11 is shown. Drive 11 has a base 13 containing a plurality of stacked, parallel magnetic disks 15 (one shown) which are closely spaced apart. Disks 15 are rotated by a motor located therebelow about a central drive hub 17. An actuator 21 is pivotally mounted to base 13 about a pivot assembly 23. A controller 25 is mounted to base 13 for selectively moving actuator 21 as will be described below.

Actuator 21 has a mounting support 27, a pair of parallel, cantilevered load beams or integrated lead suspensions 29 extending from mounting support 27, and a slider 31 having at least one magnetic read/write head secured to each suspension 29 for magnetically reading data from or magnetically writing data to disks 15. The union of a suspension 29 and a slider 31 forms a head gimbal assembly 32. Suspensions 29 have a spring-like quality which biases or maintains them in parallel relationship relative to one another. A motor assembly 33 having a conventional voice coil motor is also mounted to pivot assembly 23 opposite sliders 31. Movement of actuator 21 (indicated by arrows) moves sliders 31 radially across tracks on the disks 15 until the heads on sliders 31 settle on the target tracks.

Referring now to FIGS. 2–7, a first embodiment of the invention is shown. An integrated lead suspension 41 is of the bentlead type and comprises a laminate of three materials: a support layer of stainless steel 43, a dielectric layer of polymer such as polyimide 45, and a conductive layer of copper 47. The laminate of suspension 41 can be formed by selectively etching away different layers, or by selectively plating and building the laminate layer by layer. In one embodiment, polyimide 45 is etched by hot plasma, while steel 43 and copper 47 are etched with a conventional wet chemical etching process.

Prior to the formation of the laminate (FIGS. 2 and 3), polyimide 45 is preformed with one or more holes or voids 51 so that it is no longer homogenous. Void 51 may be formed by prestamping or pre-etching polyimide 45. After void 51 is formed in polyimide 45, the laminate of suspension 41 is made as described above. Next, copper 47 is etched through void 51, which acts as a passageway, to form traces or conductors 53 (FIGS. 4 and 5), and steel 43 is etched to form hole 55 (FIGS. 6 and 7) to give suspension 41 a "flying lead" configuration, i.e., the ends of conductors 53 are free of steel and polyimide. Although only two conductors 53 are shown, up to five conductors 53 may be formed on one side of suspension 41. As shown between FIGS. 2 and 4, void 51 in polyimide 45 may be enlarged by etching during these latter steps. Void 51 allows the laminate to be etched from a single side of the laminate. Void 51 prevents the need for double-sided etching to simplify processing and reduce the cost of suspension 41.

A second embodiment of the invention is shown in FIGS. 8–13. An integrated lead suspension 61 is of the bent lead type and comprises a laminate of three materials: a support layer of stainless steel 63, a dielectric layer of polyimide 65, and a conductive layer of copper 67. This embodiment can also be applied to a non-bent lead type ILS design such as gold ball bonding, wire stitching, solder ball reflow, etc. The laminate of suspension 61 can be formed by selectively etching away different layers, or by selectively plating and building the laminate layer by layer. In one embodiment, polyimide 65 is etched by hot plasma, while steel 63 and copper 67 are etched with a conventional wet chemical etching process.

Figure 12:
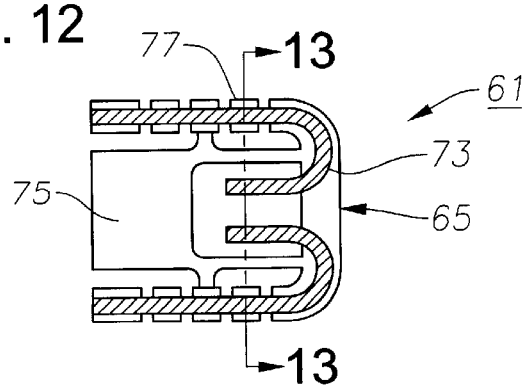
FIG. 12 is a plan view of the suspension of FIG. 8 after final processing.
Figure 13:
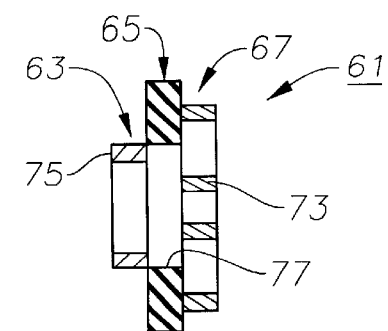
FIG. 13 is a sectional end view of the suspension of FIG. 12 taken along the line 13—13 of FIG. 12.

Prior to the formation of the laminate (FIGS. 8 and 9), polyimide 65 is preformed with voids 71 so that it is no longer homogenous. Voids 71 may be formed by prestamping or pre-etching polyimide 65. After voids 71 are made in polyimide 65, the laminate of suspension 61 is formed. Next, copper 67 is etched to form conductors 73 (FIGS. 10 and 11), and steel 63 is etched to form a support member 75 (FIGS. 12 and 13).

Figure 8:
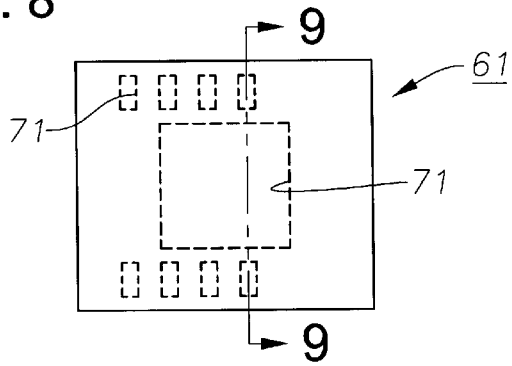
FIG. 8 is a plan view of a portion of a second embodiment of a suspension for the hard disk drive of FIG. 1 at an initial stage of processing and is constructed in accordance with the invention.
Figure 9:
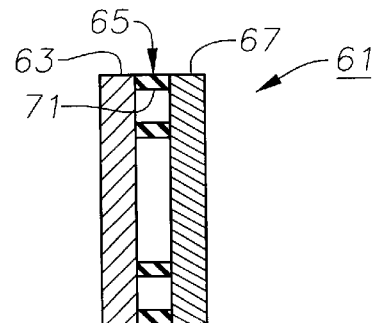
FIG. 9 is a sectional end view of the suspension of FIG. 8 taken along the line 9—9 of FIG. 8.
Figure 10:
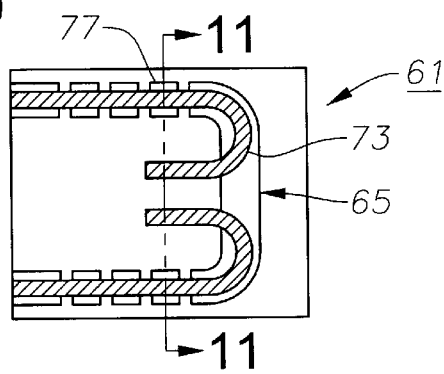
FIG. 10 is a plan view of the suspension of FIG. 8 at an intermediate stage of processing.
Figure 11:
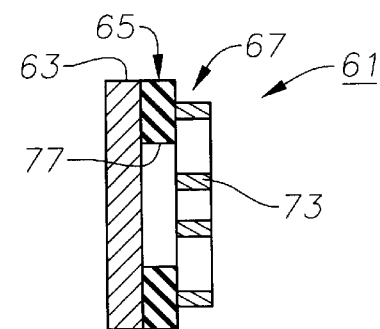
FIG. 11 is a sectional end view of the suspension of FIG. 10 taken along the line 11—11 of FIG. 10.

As shown between FIGS. 8 and 10, voids 71 in polyimide 65 are enlarged by etching during these latter steps to form "railroad ties" or islands 77. Voids 71 are used to make features such as islands 77 which are smaller than 0.18 mm in size. Islands 77 provide better control of the static attitude of the heads under changing temperature and humidity conditions. As was the case for the first embodiment, voids 71 also prevent the need for double-sided etching to simplify processing and reduce the cost of suspension 61.

Figure 14:
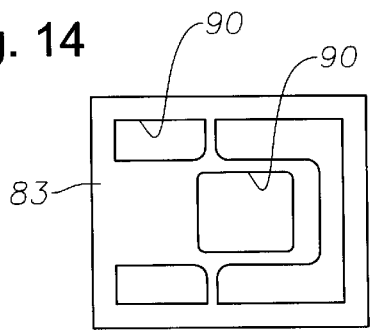
FIG. 14 is a plan view of a first layer of a third embodiment of a suspension for the hard disk drive of FIG. 1.
Figure 15:
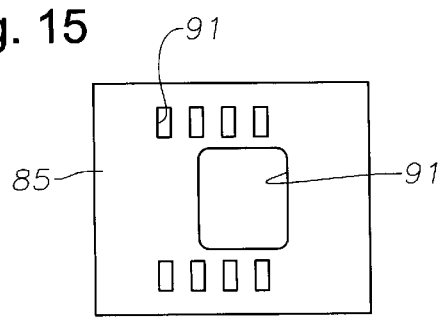
FIG. 15 is a plan view of a second layer for the third embodiment of the suspension.
Figure 16:
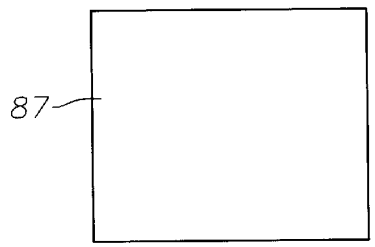
FIG. 16 is a plan view of a third layer for the third embodiment of the suspension.

Referring now to FIGS. 20–25, a third embodiment of the invention is shown. An integrated lead suspension 81 is of the bentlead type and comprises a laminate of five layers and three materials: a central support layer of stainless steel 83 (FIG. 14), a dielectric layer of polyimide 85 (FIG. 15) on each side of steel 83, and a conductive layer of copper 87 (FIG. 16) on the outer surface of each polyimide 85. The laminate of suspension 81 can be formed by selectively etching away different layers, or by selectively plating and building the laminate layer by layer. In one embodiment, polyimides 85 are etched by hot plasma, while steel 83 and coppers 87 are etched with a conventional wet chemical etching process.

Figure 17:
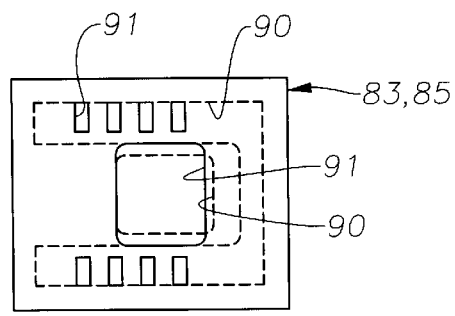
FIG. 17 is a plan view of a laminate of the second layer of FIG. 15 on top of the first layer of FIG. 14.
Figure 18:
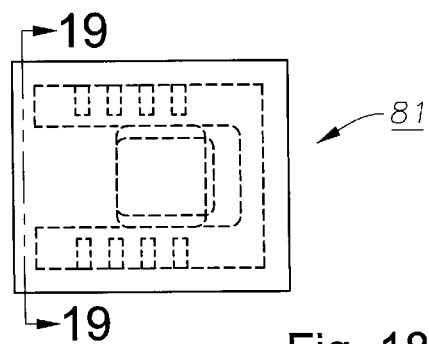
FIG. 18 is a plan view of a five-layer laminate suspension of the layers of FIGS. 14–16 and is constructed.in accordance with the invention.
Figure 19:
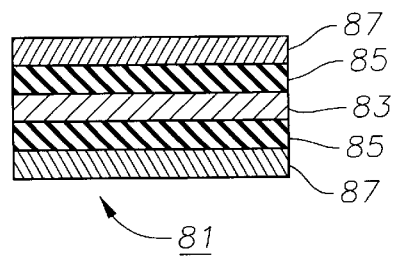
FIG. 19 is a sectional end view of the suspension of FIG. 18 taken along the line 19—19 of FIG. 18.

Prior to the formation of the laminate (FIGS. 17–19), steel 83 and polyimides 85 are preformed with voids 90 and 91, respectively (FIGS. 14 and 15), so that they are no longer homogenous. Voids 90, 91 may be formed by prestamping or pre-etching. After voids 90, 91 are made, the laminate of suspension 81 is formed (FIG. 21). Next, coppers 87 are etched to form conductors 93 (FIGS. 22 and 23), and steel 83 is etched to form a central support member 95 (FIGS. 24 and 25). Although only two conductors 93 are shown on each side of suspension 81, additional conductors 93 may be formed on each side. By utilizing this multilayer laminate approach, more conductors can be put on the same area, thus improving the real estate usage of a disk.

As shown between FIGS. 20 and 22, voids 91 in polyimides 85 are enlarged by etching during these latter steps to form islands 97. Voids 91 are used to make features such as islands 97 which are smaller than 0.18 mm in size. Islands 97 provide better control of the static attitude of the heads under changing temperature and humidity conditions. As described previously, voids 91 also prevent the need for double-sided etching to simplify processing and reduce the cost of suspension 81. Voids 90 in steel 83 eliminate the need to etch away the polyimide material located between the conductors 93 and steel 83.

The invention has many advantages. The voids prevent the need for double-sided etching to simplify processing and reduce the cost of the suspensions. If the suspension is built using the plating method, the voids are also compatible with the plating process. The voids help, create other features such as conductor support islands which are smaller than would otherwise be available by conventional methods. The islands provide better control of the static attitude of the heads under changing temperature and humidity conditions.

While the invention has been shown or described in only some of its forms, it should be apparent to those skilled in the art that it is not so limited, but is susceptible to various changes without departing from the scope of the invention.

For example, as set forth in the appended claims, the layers of the integrated lead suspension may comprise a metal support layer, one or more dielectric layers, and one or more conductor layers.

We claim:

1. A method for manufacturing an integrated lead suspension for a hard disk drive, comprising:
   (a) providing a metal support layer, at least one dielectric layer, and at least one conductor layer;
   (b) forming at least one void in the dielectric layer; then
   (c) laminating the dielectric layer between the support and conductor layers to form a laminate; and then
   (d) applying an etching liquid to the conductor layer of the laminate of step (c) to form traces, and flowing the etching liquid from the conductor layer through the void in the dielectric layer into contact with the support layer to etch the support layer and form the suspension; and
   etching the dielectric layer to increase the size of the void in the dielectric layer.

2. A method for manufacturing an integrated lead suspension for a hard disk drive, comprising:

(a) providing a metal support layer, at least one dielectric layer, and at least one conductor layer;

(b) forming a plurality of voids in the dielectric layer; then (c) laminating the dielectric layer between the support and conductor layers to form a laminate; and then (d) applying an etching liquid to the conductor layer of the laminate of step (c) to form traces, and flowing the etching liquid from the conductor layer through the void in the dielectric layer into contact with the support layer to etch the support layer and form the suspension; and etching the dielectric layer to form discrete support blocks which are defined by at least some of the voids in the dielectric layer, and wherein the support blocks separate the traces from the support layer.

3. A method for manufacturing an integrated lead suspension for a hard disk drive, comprising:

(a) providing a metal support layer, at least one dielectric layer, and at least one conductor layer;

(b) forming at least one void in the dielectric layer; then (c) laminating the dielectric layer between the support and conductor layers to form a laminate; and then (d) applying an etching liquid to the conductor layer of the laminate of step (c) to form traces, and flowing the etching liquid from the conductor layer through the void in the dielectric layer into contact with the support layer to etch the support layer and form the suspension; and wherein step (c) comprises laminating a second dielectric layer on a side of the support layer opposite said first mentioned dielectric layer, and a second conductor layer on said second dielectric layer to form a five layer laminate with the first and second conductor layers being on a top and a bottom of the five layer laminate.

4. The method of claim 3 wherein step (b) comprises forming a plurality of voids in each of the support and dielectric layers, and wherein step (d) comprises applying the etching liquid to only one of the conductor layers, the etching liquid passing through the voids in the dielectric and support layers to etch the support layer and the conductor layers.

5. The method of claim 4, further comprising the step of etching each of the dielectric layers to form discrete support blocks which are defined by at least some of the voids in the dielectric layers, and wherein the support blocks separate the traces from the support layer.

6. A method for manufacturing an integrated lead suspension for a hard disk drive, comprising:

a (a) providing a metal support layer, at least one dielectric layer, and at least one conductor layer;

(b) forming a plurality of voids in the dielectric layer wherein at least some of the voids align with one another to define trace paths; then (c) laminating the dielectric layer between the support and conductor layers to form a laminate; and then (d) applying an etching substance to the laminate of step (c) and etching the conductor and dielectric layers to form traces from the conductor layer and discrete pads between adjacent ones of the voids in the dielectric layer, wherein the pads are aligned along the trace paths such that the traces extend along outer surfaces of the pads and are spaced apart from the support layer, and etching the support layer through the voids in the dielectric layer to form the is suspension.

7. The method of claim 6 wherein step (b) further comprises forming a plurality of the voids in the support layer.

8. The method of claim 7 wherein step (c) comprises laminating a second dielectric layer on a side of the support layer opposite said first mentioned dielectric layer, and a second conductor layer on said second dielectric layer to form a five layer laminate with the first and second conductor layers being on a top and a bottom of the five layer laminate.

9. The method of claim 8 wherein step (b) comprises forming a plurality of voids in the second dielectric layer, and wherein step (d) comprises etching only one of the conductor layers such that the support layer may be etched through the voids in either dielectric layer.

10. The method of claim 8, wherein step (d) comprises forming discrete pads in the second dielectric layer, the pads being defined by said at least some of the voids in the second dielectric layer which align with one another to define trace paths, wherein the pads separate the traces from the support layer.

11. The method of claim 6, further comprising the steps of forming the support layer from steel, forming the dielectric layer from a polymer, and forming the conductor layer from copper.

* * * * *

UNITED STATES PATENT AND TRADEMARK OFFICE
CERTIFICATE OF CORRECTION

PATENT NO. : 6,596,184 B1
DATED : July 22, 2003
INVENTOR(S) : Victor Wing-Chun Shum et al.

It is certified that error appears in the above-identified patent and that said Letters Patent is hereby corrected as shown below:

Column 6,
Line 6, please remove "a" leaving only -- (a) -- indented, followed by (b), (c), etc.
Line 21, please remove the word "is" between the words "the" and "suspension" so that the sentence ends in -- the suspension --.

Signed and Sealed this

Twenty-third Day of March, 2004

JON W. DUDAS
*Acting Director of the United States Patent and Trademark Office*